(12) United States Patent
Baker et al.

(10) Patent No.: US 9,690,033 B2
(45) Date of Patent: Jun. 27, 2017

(54) WAVEGUIDES COMPRISING LIGHT SCATTERING SURFACES AND DISPLAY DEVICES COMPRISING THE SAME

(71) Applicant: CORNING INCORPORATED, Corning, NY (US)

(72) Inventors: David Eugene Baker, Bath, NY (US); Pamela Arlene Maurey, Savona, NY (US); Daniel Aloysius Nolan, Corning, NY (US); Mark Alejandro Quesada, Horseheads, NY (US); Wageesha Senaratne, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/085,235

(22) Filed: Mar. 30, 2016

(65) Prior Publication Data

US 2016/0291236 A1  Oct. 6, 2016

Related U.S. Application Data

(60) Provisional application No. 62/140,605, filed on Mar. 31, 2015.

(51) Int. Cl.
*F21V 8/00* (2006.01)
*H01L 51/52* (2006.01)
*G02B 5/02* (2006.01)

(52) U.S. Cl.
CPC ......... *G02B 6/0036* (2013.01); *G02B 6/0043* (2013.01); *G02B 6/0065* (2013.01); *H01L 51/5262* (2013.01); *H01L 51/5268* (2013.01); *G02B 5/0221* (2013.01)

(58) Field of Classification Search
CPC .. G02B 6/0036; G02B 6/0043; G02B 6/0065; H01L 51/5262; H01L 51/5268
See application file for complete search history.

(56) References Cited

U.S. PATENT DOCUMENTS

| 4,483,700 | A | 11/1984 | Forker, Jr. et al. |
| 5,674,790 | A | 10/1997 | Araujo |
| 6,428,920 | B1 | 8/2002 | Badding et al. |
| 7,432,649 | B2 | 10/2008 | West |
| 7,666,511 | B2 | 2/2010 | Ellison et al. |

(Continued)

FOREIGN PATENT DOCUMENTS

JP  2005208206 A  8/2005

OTHER PUBLICATIONS

Glass Substrates for OLED Lighting with High-Output Efficiency, Asahi Glass research, SID 2009.*

(Continued)

*Primary Examiner* — Karen Kusumakar

(57) ABSTRACT

Disclosed herein are waveguides comprising at least one scattering surface, a periodicity ranging from about 0.5 μm to about 2 μm, and an RMS roughness ranging from about 20 nm to about 60 nm. Single-layer waveguides having a thickness ranging from about 1 μm to about 100 μm are disclosed herein as well as multi-layer waveguides comprising at least one high index layer and optionally at least one low index layer. Lighting and display devices and OLEDs comprising such waveguides are further disclosed herein as well as methods for making the waveguides.

28 Claims, 6 Drawing Sheets

(56) References Cited

U.S. PATENT DOCUMENTS

| | | | |
|---|---|---|---|
| 8,907,365 B2 | 12/2014 | Baker et al. | |
| 2008/0081181 A1* | 4/2008 | Hildenbrand | C08J 7/18 |
| | | | 428/333 |
| 2009/0041984 A1* | 2/2009 | Mayers | C03C 17/007 |
| | | | 428/141 |
| 2014/0140091 A1* | 5/2014 | Vasylyev | G02B 6/001 |
| | | | 362/606 |
| 2014/0291656 A1 | 10/2014 | Gollier et al. | |
| 2016/0072083 A1 | 3/2016 | Lecamp et al. | |

OTHER PUBLICATIONS

Advanced Glass SUbstrate for the Enhancment of OLED Lighting Out-coupling Efficiency, Asahi, SID 2013.*

Novel Light-Scattering Glass Substrate for the enhancment of OLED Lighting Out-coupling Efficiency, Asahi, SID 2012.*

Glass Substrates for OLED Lighting with High Out-coupling Efficiency Asahi Glass research, SID 2009; Advanced Glass Substrate for the Enhancement of OLED Lighting Out-coupling Efficiency, Asahi, SID, 2013; Novel Light-Scattering Glass Substrate for the Enhancement of OLED Lighting Out-coupling Efficiency, Asahi, SID, 2012.

International Search Report and Written Opinion PCT/US2016/024881 Dated Jun. 17, 2016.

\* cited by examiner

WAVEGUIDES COMPRISING LIGHT SCATTERING SURFACES AND DISPLAY DEVICES COMPRISING THE SAME

This application claims the benefit of priority under 35 U.S.C. §119 of U.S. Provisional Application Ser. No. 62/140,605 filed on Mar. 31, 2015 the content of which is relied upon and incorporated herein by reference in its entirety.

FIELD OF THE DISCLOSURE

The disclosure relates generally to waveguides and lighting and display devices comprising such waveguides, and more particularly to waveguides comprising at least one light-scattering surface layer and OLED lighting and display devices comprising the same.

BACKGROUND

High-performance display devices, such as liquid crystal (LC), organic light-emitting diode (OLED), and plasma displays, are commonly used in various electronics, such as cell phones, laptops, electronic tablets, televisions, and computer monitors. Currently marketed display devices can employ one or more high-precision glass sheets, for example, as substrates for electronic circuit components, as light extraction layers, as light guide plates, or as color filters, to name a few applications. OLED light sources have increased in popularity for use in display and lighting devices due to their improved color gamut, high contrast ratio, wide viewing angle, fast response time, low operating voltage, and/or improved energy efficiency. Demand for OLED light sources for use in curved displays has also increased due to their relative flexibility.

A basic OLED structure can comprise an organic light-emitting material disposed between an anode and a cathode. The multi-layer structure can include, for example, an anode, a hole injection layer, a hole transporting layer, an emitting layer, an electron transporting layer, an electron injection layer, and a cathode. During operation, the injected electrons from the cathode and holes from the anode can be recombined in the emitting layer to generate excitons. When current is supplied to the organic light emitting material, light is given off due to the radioactive decay of the excitons. To form a display device comprising an OLED, a plurality of anodes and cathodes can be driven by a thin film transistor (TFT) circuit. The TFT array thus provides an array of pixels which can then be used to display selected images by the application of current through the anodes and cathodes.

While OLED display devices may have numerous advantages over other display devices, such as LCDs, OLEDs may still suffer from one or more drawbacks. For example, OLEDs can have limited light output efficiency (luminance) as compared to other light sources. In some instances, as much as 80% of the light energy emitted by the OLED may be trapped in the display device. Light generated by the emitting layer can, for instance, be confined within the electrode and glass substrate of the device due to a large difference in refractive index (n) values for these layers (e.g., $n_e \approx 1.9$, $n_g \approx 1.5$). Snell's law suggests that the difference in refractive indices produces a low out-coupling efficiency in the range of about 20%, where the efficiency level is expressed as the ratio of surface emission to the total emitted light. Thus, even though internal efficiencies nearing 100% have been reported, the low out-coupling efficiency ultimately limits the brightness and efficiency of the OLED device.

Numerous methods for improving light extraction efficiency of OLED devices have been proposed, including high index substrates and particles and/or various surface modifications. However, these techniques may require expensive materials and/or complex processes, such as photolithography and the like, which can unnecessarily increase the manufacturing time and overall cost of the device. Attempts to increase the light output of an OLED device have also included driving the OLED at relatively high current levels. However, such high currents can have a negative impact on the lifespan of the OLED and thus also fail to provide an ideal solution.

Other attempts to improve light extraction efficiency include, for example, waveguides that are matched to the OLED layer in thickness and/or index, such that modes within the OLED can be matched with modes within the waveguide. Such waveguides can be deposited on a glass substrate and subsequently coated with a planarizer (e.g., smoothing) layer. Improved light extraction has been observed with relatively thin planarizer layers (e.g., less than about 0.5 microns). Thicker planarizer layers may, for example, yield an insufficiently small overlap between the evanescent OLED light and the waveguide modes. However, thinner planarizer layers may result in an overly rough interface between the waveguide and OLED layer, which can cause coupling within the modes of the OLED, such that light can couple from one of these propagating modes to a surface plasmon mode (or surface plasmon polariton). Surface plasmon modes are highly absorbing and, thus, coupling of light to these modes is typically undesirable.

Accordingly, it would be advantageous to provide waveguides for display (e.g., OLED) devices that can provide improved light extraction efficiency while also reducing the cost, complexity, and/or time for manufacturing the device. Additionally, it would be advantageous to provide waveguides having a desirable surface roughness while also maintaining a relatively low planarizer layer thickness. In various embodiments, display devices (such as OLED displays) comprising such substrates may have one or more advantages, such as improved brightness, color gamut, contrast ratio, viewing angle, response time, flexibility, and/or energy efficiency.

SUMMARY

The disclosure relates, in various embodiments, to waveguides having two scattering surfaces and comprising a thickness ranging from about 1 μm to about 100 μm, a periodicity ranging from about 0.5 μm to about 2 μm, and an RMS roughness ranging from about 20 nm to about 60 nm. Waveguides comprising at least one scattering surface are also disclosed herein, the waveguides comprising a substrate and at least one first layer comprising a first material having a refractive index of at least about 1.8 and a thickness ranging from about 300 nm to about 10 μm; and optionally at least one second layer comprising a second material having a refractive index of less than about 1.8 and a thickness of less than about 100 nm, wherein the waveguide comprises a periodicity ranging from about 0.5 μm to about 2 μm, and wherein the at least one scattering surface comprises an RMS roughness ranging from about 20 nm to about 60 nm. Further disclosed herein are waveguides comprising n first layers comprising a first material having a firs refractive index, 2n scattering surfaces comprising an RMS roughness ranging from about 20 nm to about 60 nm; n−1 second layers comprising a second material having a second refractive index lower than the first refractive index; and a planarizer layer having an RMS surface roughness of less than about 20 nm, wherein n is greater than or equal to 1. OLEDs and display devices comprising such waveguides are also disclosed herein.

Still further disclosed herein are methods for making a waveguide, the methods comprising preparing a green body from batch materials comprising at least one component having a refractive index of at least about 1.8 and optionally at least one additive chosen from solvents, binders, dispersants, surfactants, and plasticizers; and sintering the green body at a temperature greater than about 1000° C. to form a waveguide having two scattering surfaces, wherein the waveguide comprises a thickness ranging from about 1 µm to about 100 µm, a periodicity ranging from about 0.5 µm to about 2 µm, and an RMS roughness ranging from about 20 nm to about 60 nm. Additional disclosed methods for making waveguides comprise coating a substrate with a first mixture comprising a first material having a refractive index of at least about 1.8; optionally coating the substrate with a second mixture comprising a second material having a refractive index of less than about 1.8; and heat treating the coated substrate at a temperature greater than about 250° C. to form a waveguide having at least one scattering surface.

According to various embodiments, the waveguide can comprise a sheet of high index material such as zirconia. The grain size of the waveguide can range, for example, from about 200 nm to about 500 nm and, in some embodiments the density of the waveguide can be greater than about 3 g/cm$^3$. In additional embodiments, the waveguide can further comprise a planarizer layer disposed on at least one scattering surface. The planarizer layer can have a thickness, for example, of less than about 500 nm, and an RMS roughness of less than about 30 nm. According to further embodiments, the waveguide can comprise a glass substrate and at least one first layer comprising zirconia. In yet further embodiments, the waveguide can comprise alternating first and second layers of high and low index materials.

Additional features and advantages of the disclosure will be set forth in the detailed description which follows, and in part will be readily apparent to those skilled in the art from that description or recognized by practicing the methods as described herein, including the detailed description which follows, the claims, as well as the appended drawings.

It is to be understood that both the foregoing general description and the following detailed description present various embodiments of the disclosure, and are intended to provide an overview or framework for understanding the nature and character of the claims. The accompanying drawings are included to provide a further understanding of the disclosure, and are incorporated into and constitute a part of this specification. The drawings illustrate various embodiments of the disclosure and together with the description serve to explain the principles and operations of the disclosure.

BRIEF DESCRIPTION OF THE DRAWINGS

The following detailed description can be further understood when read in conjunction with the following drawings.

DETAILED DESCRIPTION

Devices

Disclosed herein are waveguides having two scattering surfaces and comprising a thickness ranging from about 1 µm to about 100 µm, a periodicity ranging from about 0.5 µm to about 2 µm, and an RMS roughness ranging from about 20 nm to about 60 nm. Waveguides comprising at least one scattering surface are also disclosed herein, the waveguides comprising a substrate and at least one first layer comprising a first material having a refractive index of at least about 1.8 and a thickness ranging from about 300 nm to about 10 µm, and optionally at least one second layer comprising a second material having a refractive index of less than about 1.2 and a thickness of less than about 100 nm, wherein the waveguide comprises a periodicity ranging from about 0.5 µm to about 2 µm, and wherein the at least one scattering surface comprises an RMS roughness ranging from about 20 nm to about 60 nm. OLEDs and lighting or display devices comprising such waveguides are also disclosed herein.

Figure 1:
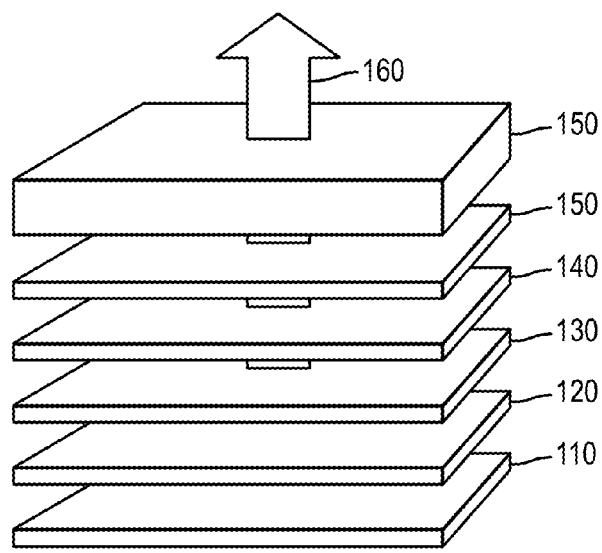
FIG. 1 illustrates a light emitting device according to various embodiments of the disclosure.

FIG. 1 depicts an exemplary light emitting device according to various embodiments of the disclosure. The device can comprise a cathode 110, an electron transporting layer 120, an emissive layer 130, a hole transporting layer 140, an anode 150, and a waveguide 160. In the depicted embodiment, the device may emit light through the waveguide 160, in which case the anode 150 may comprise a substantially transparent or semi-transparent material, such as indium tin oxide (ITO) or any other conductive material with a suitable transparency. In other embodiments, the device can emit light through a transparent or semi-transparent cathode 110, e.g., an organic layer, in which case the waveguide 160 may be positioned adjacent the cathode 110 (not depicted). Additional layers in the light emitting device can include a hole injection layer (HIL) and/or an electron injection layer (EIL) (not illustrated). Waveguides disclosed herein can be utilized alone, e.g., as a light scattering layer and as a substrate, or can be used in addition to substrate (not shown), e.g., as a light scattering layer between the anode or cathode and the substrate.

The waveguide can comprise a first surface and an opposing second surface. In some embodiments, the waveguide can be a sheet comprising one layer or multiple layers. The surfaces may, in certain embodiments, be planar or substantially planar, e.g., substantially flat and/or level. The waveguide can also, in some embodiments, be curved about at least one radius of curvature, e.g., a three-dimensional waveguide, such as a convex or concave waveguide. The first and second surfaces may, in various embodiments, be parallel or substantially parallel. The waveguide may further comprise at least one edge, for instance, at least two edges, at least three edges, or at least four edges. By way of a non-limiting example, the waveguide may comprise a rectangular or square sheet having four edges, although other shapes and configurations are envisioned and are intended to fall within the scope of the disclosure.

Figure 2:
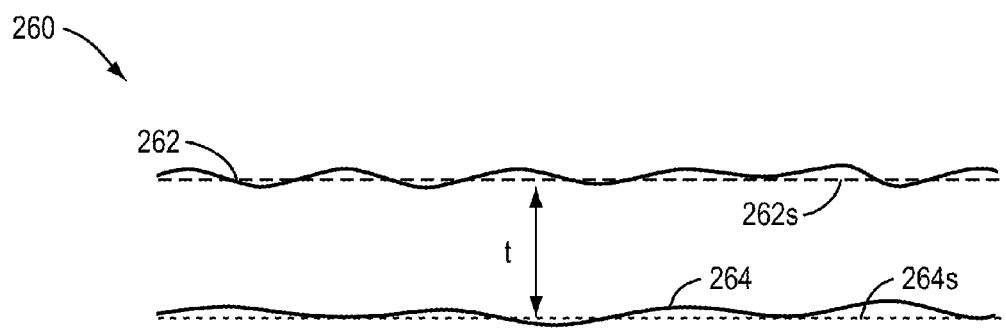
FIG. 2 depicts an exemplary single-layer waveguide according to certain embodiments of the disclosure.

As shown in FIG. 2, an exemplary "single-layer" waveguide 260 can comprise a single sheet of a high index material having a thickness t. A first scattering surface 262 and can have a first roughness 262s. A second scattering surface 264 can have a second roughness 264s. As used herein, the term "high index material" refers to materials having a refractive index of at least about 1.8, for example, the refractive index may be as high as 2.8. In certain embodiments, the refractive index may range from about 1.8 to about 2.5, from about 1.9 to about 2.3, or from about 2 to about 2.1, including all ranges and subranges therebetween. The first and second surfaces can be characterized by an RMS surface roughness ranging from about 20 nm to about 60 nm, such as from about 25 nm to about 50 nm, from about 30 nm to about 45 nm, or from about 35 nm to about 40 nm, including all ranges and subranges therebetween. The roughness of the first and second surfaces can be identical or different, according to various embodiments. RMS roughness is described in ASME B46.1 as the root mean square average of the profile height deviations from the mean line, recorded within the evaluation length.

Non-limiting examples of suitable high index materials can include, for instance, zirconia, yttria stabilized zirconia, alumina, zinc oxide, ceria, spinel, anatase or rutile titania, niobia, tin oxide, and combinations thereof. The single-layer waveguide can be a standalone sheet or can be used in combination with a substrate, e.g., a glass substrate, in certain embodiments. The thickness t of the single-layer waveguide can range, for example, from about 1 μm to about 100 μm, such as from about 5 μm to about 90 μm, from about 10 μm to about 80 μm, from about 20 μm to about 70 μm, from about 30 μm to about 60 μm, or from about 40 μm to about 50 μm, including all ranges and subranges therebetween. The periodicity of the single-layer waveguide can range, for example, from about 0.5 μm to about 2 μm, such as from about 1 μm to about 1.5 μm (e.g., 0.6, 0.7, 0.8, 0.9, 1, 1.1, 1.2, 1.3, 1.4, 1.5, 1.6, 1.7, 1.8, 1.9, or 2 μm), including all ranges and subranges therebetween. As used herein, the term "periodicity" refers to the distance over which the surface-sinusoidal wave shape repeats itself.

According to various embodiments, the single-layer waveguide can have a high density and/or low porosity. For instance, the density of the single-layer waveguide can be greater than about 3 $g/cm^3$, such as greater than about 4 $g/cm^3$, greater than about 5 $g/cm^3$, greater than about 6 $g/cm^3$, greater than about 7 $g/cm^3$, greater than about 8 $g/cm^3$, greater than about 9 $g/cm^3$, or greater than about 10 $g/cm^3$, or higher, including all ranges and subranges therebetween. The porosity of the single-layer waveguide may, in some embodiments, be less than about 10%, such as less than about 5%, less than about 4%, less than about 3%, less than about 2%, or less than about 1%, including all ranges and subranges therebetween. According to additional embodiments, the grain size can range, for example, from about 200 nm to about 500 nm, such as from about 225 nm to about 450 nm, from about 250 nm to about 400 nm, or from about 300 nm to about 350 nm, including all ranges and subranges therebetween.

The single-layer waveguide can comprise, in some embodiments, a planarizer or smoothing layer on the first and/or second surface. The planarizer layer can, for example, have a thickness of less than or equal to about 500 nm, such as less than about 450 nm, less than about 400 nm, less than about 350 nm, less than about 300 nm, or less than about 250 nm, including all ranges and subranges therebetween. According to various embodiments, the planarizer layer can comprise at least one material chosen from optical polymers and glasses, for instance, transparent polymers and glasses, such as polymethylsilsesquioxanes, polyphenylsilsesquioxanes polymethylphenylsilsesquioxanes polymethylsiloxanes, polysilicatesilsesquioxanes, silicates, partially polymerized polymethylsiloxane (e.g. T-12, T-11, 512B spin on glass (Honeywell)), polydimethylsiloxane, polydiphenyl siloxane, partially polymerized polysilsesquioxane, polymethylsilsesquioxane(HardSil™ AM, Gelest Chemicals), and polyphenylsilsequioxane, polymethylphenyl silsesquioxane (HardSil™ AP, Gelest) or nanoparticle containing polymethylsilsesquioxane or polyphenylmethysilsesquioxane, where the nanoparticles can be titania, silica or zirconia. The first and/or second surface coated with the planarizer layer can have, for instance, an RMS roughness of less than about 20 nm, such as less than about 15 nm, less than about 10 nm, or less than about 5 nm (e.g., 20, 19, 18, 17, 16, 15, 14, 13, 12, 11, 10, 9, 8, 7, 6, 5, 4, 3, 2, or 1 nm), including all ranges and subranges therebetween.

Figure 3:
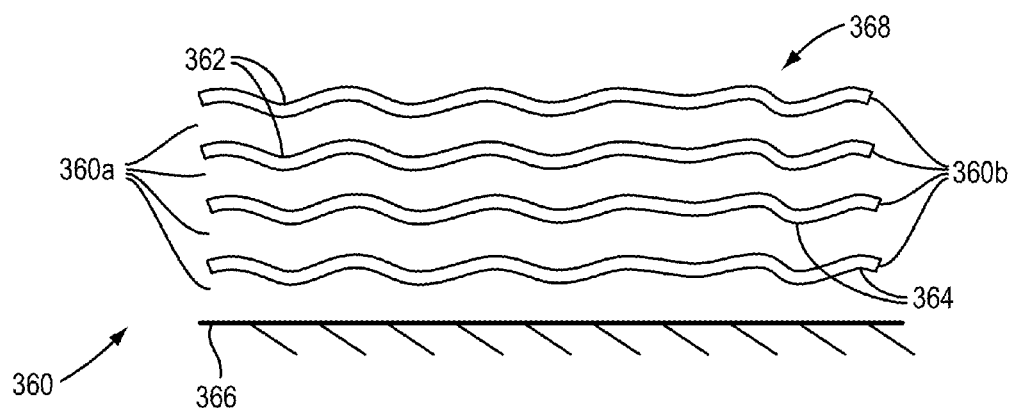
FIG. 3 depicts an exemplary multiple-layer waveguide according to various embodiments of the disclosure.

According to additional embodiments, as shown in FIG. 3, a "multi-layer" waveguide 360 may comprise multiple layers 360a and 360b deposited on a substrate 366. For example, alternating layers of high index material 360a and low index material 360b can be deposited on the substrate 366. Each layer of the high index material can comprise a first scattering surface 362 and a second scattering surface 364, each independently having a roughness as disclosed above with respect to the single layer waveguide (e.g., ranging from less than 20 nm to 60 nm). The thickness of each high index layer 360a can independently range, in some embodiments, from about 300 nm to about 10 μm, such as from about 500 nm to about 9 μm, from about 750 nm to about 8 μm, from about 1 μm to about 7 μm, from about 1.5 μm to about 6 μm, from about 2 μm to about 5 μm, or from about 3 μm to about 4 μm, including all ranges and subranges therebetween. Moreover, the density of each high index layer 360a can range, for example, from about 1.5 $g/cm^3$ to about 6 $g/cm^3$, such as from about 2 $g/cm^3$ to about 5 $g/cm^3$, or from about 3 $g/cm^3$ to about 4 $g/cm^3$, including all ranges and subranges therebetween.

As used herein, the term "low index material" refers to materials having a refractive index of less than about 1.8, for example, the refractive index can be as low as 1.4. In certain embodiments, the refractive index can range from about 1.4 to about 1.7, or from about 1.5 to about 1.6, including all ranges and subranges therebetween. Non-limiting examples of suitable low index materials can include, for instance, polymethylsilsesquioxanes, polyphenylsilsesquioxanes polymethylphenylsilsesquioxanes polymethylsiloxanes, polysilicatesilsesquioxanes, silicates, partially polymerized polymethylsiloxane (e.g. T-12, T-11, 512B spin on glass (Honeywell)), polydimethylsiloxane, polydiphenyl siloxane, partially polymerized polysilsesquioxane, polymethylsilsesquioxane(HardSil™ AM, Gelest Chemicals), and polyphenylsilsequioxane, polymethylphenyl silsesquioxane (HardSil™ AP, Gelest) or nanoparticles containing polymethylsilsesquioxane or polyphenylmethysilsesquioxane, where the nanoparticles can be titania, silica, or zirconia, and combinations thereof. The thickness of each low index layer 360b can be less than about 500 nm, for example, independently ranging from about 5 nm to about 400 nm, from about 10 nm to about 300 nm, from about 20 nm to about 200 nm, from about 30 nm to about 100 nm, from about 40 nm to about 90 nm, from about 50 nm to about 80 nm, from about 60 nm to about 70 nm, or less than 5 nm, including all ranges and subranges therebetween.

According to various embodiments, each combination of a high index layer and a low index layer can be referred to as a "composite" layer. The composite layer can have a periodicity ranging, for instance, from about 0.5 μm to about 2 μm, such as from about 1 μm to about 1.5 μm (e.g., 0.6, 0.7, 0.8, 0.9, 1, 1.1, 1.2, 1.3, 1.4, 1.5, 1.6, 1.7, 1.8, 1.9, or 2 μm), including all ranges and subranges therebetween. The multi-layer waveguide can comprise, in certain embodiments, high and low index layers deposited on a glass substrate 366. The glass substrate can comprise, for example, any glass known in the art for use as a glass substrate in an OLED including, but not limited to, aluminosilicate, alkali-aluminosilicate, borosilicate, alkali-borosilicate, aluminoborosilicate, alkali-aluminoborosilicate, and other suitable glasses.

In certain embodiments, the substrate may have a thickness of less than or equal to about 3 mm, for example, ranging from about 0.1 mm to about 2.5 mm, from about 0.3 mm to about 2 mm, from about 0.7 mm to about 1.5 mm, or from about 1 mm to about 1.2 mm, including all ranges and subranges therebetween. Non-limiting examples of commercially available glasses suitable for use as a light filter include, for instance, EAGLE XG®, Iris™, Lotus™, Willow®, and Gorilla® glasses from Corning Incorporated. Suitable glasses are disclosed, for example, in U.S. Pat. Nos. 4,483,700, 5,674,790, and 7,666,511, which are incorporated herein by reference in their entireties, which are incorporated herein by reference in their entireties.

In further embodiments, the multi-layer waveguide can comprise at least two high index layers, such as at least three, at least four, at least five, or more, high index layers. According to yet further embodiments, the multi-layer waveguide can comprise at least one low index layer, such as at least two, at least three, at least four, at least five, or more, low index layers. Accordingly, the multi-layer waveguide can comprise at least one scattering surface, e.g., the first and/or second surface of each high index layer can be a light scattering surface. For example, the multi-layer waveguide can comprise at least one, at least two, at least three, at least four, at least five, at least six, at least seven, at least eight, at least nine, at least ten, or more, light scattering surfaces.

According to various embodiments, the waveguide can comprise n high index layers, 2n-1 scattering surfaces; n-1 low index layers; and a planarizer layer, wherein n is greater than or equal to 1. For example, n can range from 1 to 10 or greater than 10, such as from 2 to 9, from 3 to 8, from 4 to 7, or from 5 to 6, including all ranges and subranges therebetween. According to various embodiments, the high index layer can have a first refractive index and the low index layer can have a second refractive index that is lower than the first refractive index. For instance, the first refractive index can be at least about 1.8, such as ranging from about 1.8 to about 2.8, and the second refractive index can be less than or equal to about 2.1, such as ranging from about 1.4 to about 2.1. The planarizer layer can comprise an exterior surface of the waveguide, e.g., a layer in contact with an OLED device or OLED layer.

The roughness of each scattering surface in the multi-layer waveguide can vary from layer to layer as desired or can be constant throughout the waveguide. For instance, each low index layer can be used as a smoothing layer to some extent, which can reduce the roughness of each high index layer. The multi-layer waveguide can comprise, in some embodiments, an outer surface 368. In certain additional embodiments, a planarizer or smoothing layer may be deposited on the outer surface. The planarizer layer can have a thickness, composition, and roughness similar to that described above for the single-layer waveguide. As such, the roughness of each scattering surface can vary throughout the waveguide, for instance, with a smoother outer surface 368 and progressively rougher surfaces as the layers approach the substrate. In some embodiments, the outer surface may have an RMS roughness of less than about 20 nm, with any interior scattering surfaces having a roughness ranging from about 20 nm to about 60 nm. For instance, the surface roughness can progress from less than about 20 nm on the exterior surface up to about 60 nm for the interior surfaces as they approach the substrate.

As used herein, the terms "light scattering surface," "scattering surface," and "scattering layer" are used interchangeably to refer to a region capable of scattering incident light. The "surfaces" need not be exterior surfaces (as in the case of the two exterior surfaces of a single-layer waveguide). Rather, in the case of a multi-layer waveguide, the "surfaces" can also refer to interior scattering regions within the stack of layers (e.g., the interfaces between layers). Light extraction in the single-layer waveguide can occur by way of surface scattering (exterior scattering surfaces). Light extraction in the multiple-layer waveguide can occur by way of surface scattering (exterior and/or interior scattering surfaces) and/or volumetric scattering mechanisms (voids in the layers).

Methods

Disclosed herein are methods for making a waveguide, the methods comprising preparing a green body from batch materials comprising at least one component having a refractive index of at least about 1.8 and optionally at least one additive chosen from solvents, binders, dispersants, surfactants, and plasticizers; and sintering the green body at a temperature greater than about 1000° C. to form a waveguide having two scattering surfaces, wherein the waveguide comprises a thickness ranging from about 1 μm to about 100 μm, a periodicity ranging from about 0.5 μm to about 2 μm, and an RMS roughness ranging from about 20 nm to about 60 nm. Also disclosed herein are methods for making waveguides, the methods comprise coating a substrate with a first mixture comprising a first material having a refractive index of at least about 1.8; optionally coating the substrate with a second mixture comprising a second material having a refractive index of less than about 1.8; and heat treating the coated substrate at a temperature greater than about 250° C. to form a waveguide having at least one scattering surface.

For example, a single-layer waveguide can be prepared by tape casting, slot coating, spin coating, or dipcoating a batch composition comprising at least one high index material to form a green body. Other techniques for forming a thin high index material sheet are also envisioned as falling within the scope of the disclosure. According to various embodiments, the high index material can comprise nanoparticles, such as zirconia, alumina, zinc oxide, ceria, spinel, anatase or rutile titania, niobia, and tin oxide nanoparticles, and combinations thereof. The nanoparticles can have an average particle size ranging, for example, from about 5 nm to about 100 nm, such as from about 10 nm to about 75 nm, from about 20 nm to about 60 nm, from about 25 nm to about 50 nm, or from about 30 nm to about 40 nm, including all ranges and subranges therebetween. The nanoparticles may further comprise at least one stabilizing agent, such as Y, Yb, Ca, Mg, Sc, and combinations thereof. For example, the nanoparticles may comprise up to about 9 mol % of the at least one stabilizing agent, such as from about 1 mol % to about 8 mol %, from about 2 mol % to about 7 mol %, from about 3 mol % to about 6 mol %, or from about 4 mol % to about 5 mol % by weight of stabilizing agent. In certain embodiments, the nanoparticles may comprise yttria stabilized tetragonal zirconia nanoparticles, such as 3YSZ (3 mol % yttria stabilized zirconia).

According to various embodiments, the batch composition for producing single-layer waveguides can comprise from about 5% to about 50% by weight of nanoparticles, such as from about 10% to about 40%, or from about 20% to about 30% by weight of high index material, including all ranges and subranges therebetween. The batch materials may further comprise one or more additives chosen from solvents, binders, dispersants, surfactants, plasticizers, and the like. Suitable solvents may include, for example, water, alcohols, polar and nonpolar organic solvents, and combinations thereof. Binders may be used, for instance, to hold the nanoparticles together during the sintering process. Non-limiting examples of binders include, for example, poly vinyl alcohol, acrylics, poly vinyl butyral, poly ethylene oxide and polyethylene glycols of various molecular weights, polyvinyl pyrrolidone, cellulosics such as hydroxymethylcellulose, hydroxyethylcellulose and hydroxyproplycellulose, gums such as agar gum and gum Arabic, acrylics, vinylacrylics, acrylic acids, polyacrylamides, starches, and combinations thereof. Dispersants or surfactants can be used to coat the nanoparticles and/or to minimize agglomeration. Suitable dispersants or surfactants can include, for example, Emphos PS-21A and flocculating agents such as glacial acetic acid. Plasticizers can be included in the batch materials to enhance malleability. Exemplary plasticizers include, but are not limited to, dibutyl phthalate, butyl phenyl phthalate, low molecular weight poly ethylene glycol, and combinations thereof. Other suitable batch composition components are described in U.S. Pat. No. 6,428,920, which is incorporated herein by reference in its entirety.

The green body can be subjected to a thermal treatment step, for example, to burn off any organic materials present in the batch. For instance, the green body may be heated to a first temperature greater than about 250° C., such as greater than about 300° C., greater than about 350° C., greater than about 400° C., greater than about 450° C. greater than about 500° C., greater than about 600° C., greater than about 700° C., greater than about 800° C., or greater than about 850° C., including all ranges and subranges therebetween. Thermal treatment times can vary depending on the application and/or desired properties of the waveguide and can range, for example, from about 30 minutes hour to about 3 hours, such as from about 1 hour to about 2 hours, including all ranges and subranges therebetween. The green body can subsequently be sintered at a second temperature greater than about 1000° C., such as ranging from about 1000° C. to about 1600° C., from about 1050° C. to about 1500° C., from about 1100° C. to about 1400° C., or from about 1200° C. to about 1300° C., including all ranges and subranges therebetween. Sintering times can vary depending on the application and/or the desired properties of the waveguide and can range, for example, from about 30 minutes to about 3 hours, such as from about 1 hour to about 2 hours, including all ranges and subranges therebetween.

Multi-layer waveguides can be prepared by slot coating, spin coating, or dip coating a substrate, e.g., a glass substrate, with a batch composition comprising a high index material. Other techniques suitable for depositing layers on the substrate are also envisioned as falling within the scope of the disclosure. According to various embodiments, the batch composition for producing multi-layer waveguides can comprise from about 3% to about 30% by weight of high index material, such as from about 5% to about 20%, or from about 10% to about 15% by weight of nanoparticles, including all ranges and subranges therebetween. The batch materials may also comprise solvents, binders, dispersants, surfactants, and/or plasticizers as described above with respect to the single-layer waveguide. The coated substrate can then be thermally treated as described above to remove any organic materials in the high index coating and subsequently sintered. A low index material may be coated onto the substrate using the same or different techniques used to deposit the high index layer. The low index batch materials can likewise comprise at least one additive as described herein. At least one additional high index layer may then be applied to the substrate by similar or different techniques, followed by at least one low index material layer, and so forth, without limitation. Heating and/or sintering steps can be carried out between each coating step or after coating, in any desired combination.

Figure 4:
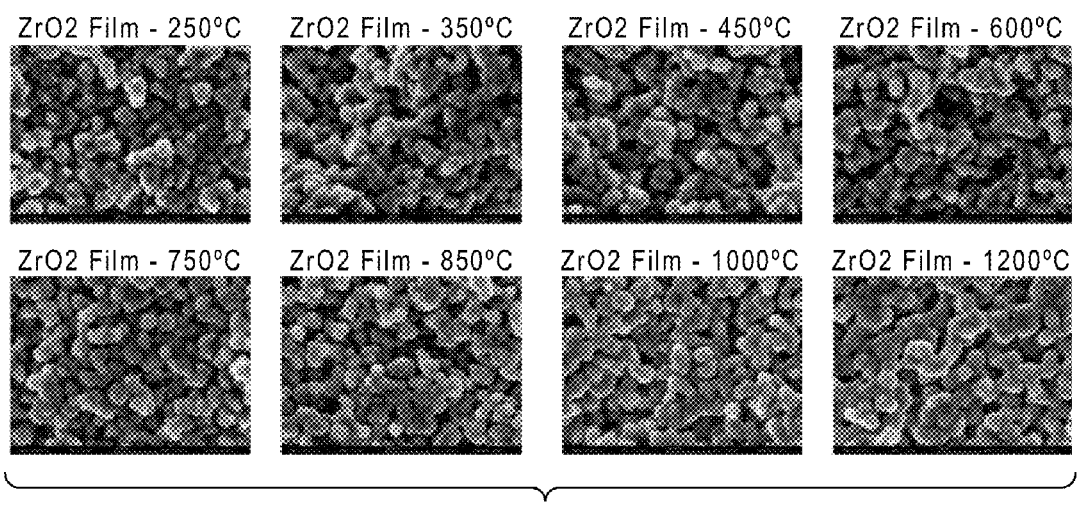
FIG. 4 depicts SEM images of zirconia at various thermal treatment temperatures.

In certain embodiments, the multi-layer waveguide can be prepared without a sintering step. For instance, the high index and low index layers can be sequentially applied using only a thermal treatment step in between and/or after coatings to remove the organic materials (e.g., solvents, binders, dispersants, etc.) from the layers. The thermal treatment step can thus combust or evaporate one or more of the additives thereby leaving voids in the waveguide structure. In the absence of a sintering step, these voids can remain open or, in some embodiments, a portion or all of them can be filled with the planarizer material in a subsequent coating step. Voids dispersed throughout the multi-layer waveguide can advantageously provide additional light scattering by way of volumetric scattering mechanisms. By way of a non-limiting example, FIG. 4 depicts scanning electron microscope (SEM) images of a zirconia layer coated onto a glass substrate after thermal treatment at increasing temperatures. At temperatures up to about 800° C., as the temperature increases the voids in the zirconia layer also increase. At temperatures greater than 800° C., the zirconia begins to consolidate as indicating by a decrease in coating thickness (<800° C.~1.5-2 µm; >800° C.~0.5 µm). At approximately 1000° C., noticeable sintering of the zirconia particles to form larger grains is observed.

A planarizer layer can be applied to one or more of the surfaces of the waveguides disclosed herein, e.g., to the first and/or second surfaces of the single-layer waveguide or to the outer surface of the multi-layer waveguide. The planarizer layer can be applied using any method known in the art, for example, slot coating, dip coating, vacuum deposition, and other similar processes. In some embodiments, the planarizer layer can have a thickness of less than about 500 nm, such as less than about 400 nm, less than about 300 nm, less than about 200 nm, or less than about 100 nm, including all ranges and subranges therebetween. The RMS roughness of the planarizer layer can, in various embodiments, be less than about 20 nm, such as less than about 15 nm, less than about 10 nm, or less than about 5 nm, including all ranges and subranges therebetween.

It will be appreciated that the various disclosed embodiments may involve particular features, elements or steps that are described in connection with that particular embodiment. It will also be appreciated that a particular feature, element or step, although described in relation to one particular embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. Thus, for example, reference to "a layer" includes examples having two or more such layers unless the context clearly indicates otherwise. Likewise, a "plurality" is intended to denote "more than one." As such, a "plurality of layers" includes two or more such layers, such as three or more such layers, etc.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values are equal or approximately equal. In some embodiments, "substantially similar" may denote values within about 10% of each other, such as within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a device that comprises A+B+C include embodiments where a device consists of A+B+C and embodiments where a device consists essentially of A+B+C.

It will be apparent to those skilled in the art that various modifications and variations can be made to the present disclosure without departing from the spirit and scope of the disclosure. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

The following Examples are intended to be non-restrictive and illustrative only, with the scope of the invention being defined by the claims.

EXAMPLES

Single-Layer Waveguide

Figure 5A:
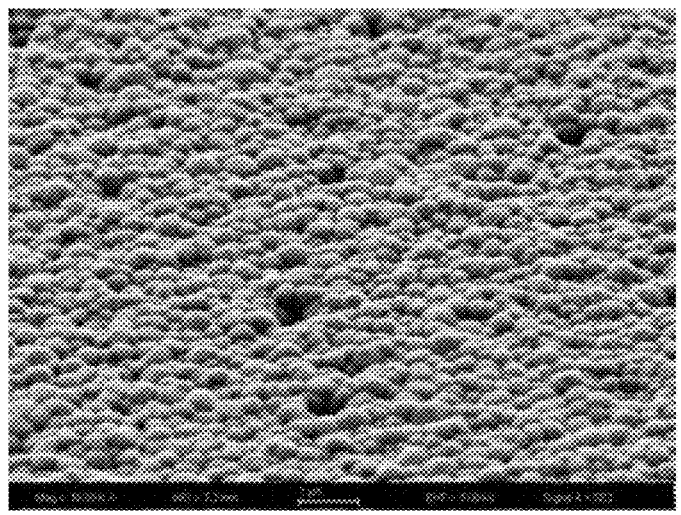
FIGS. 5A-C are SEM images of a single-layer waveguide according to certain embodiments of the disclosure.
Figure 5B:
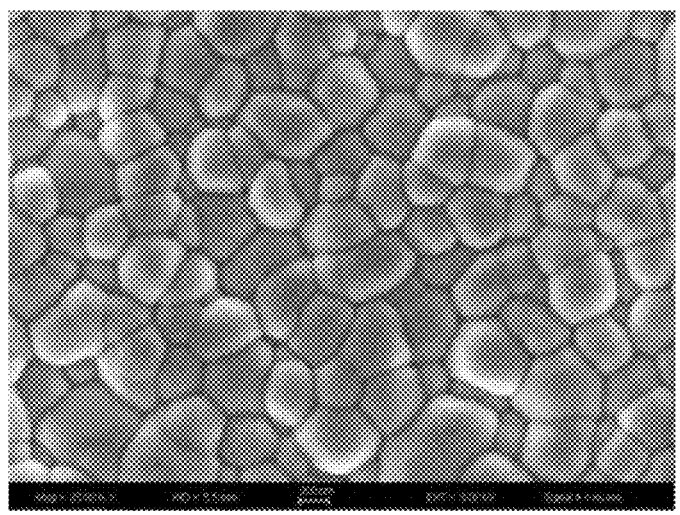
Figure 5C:
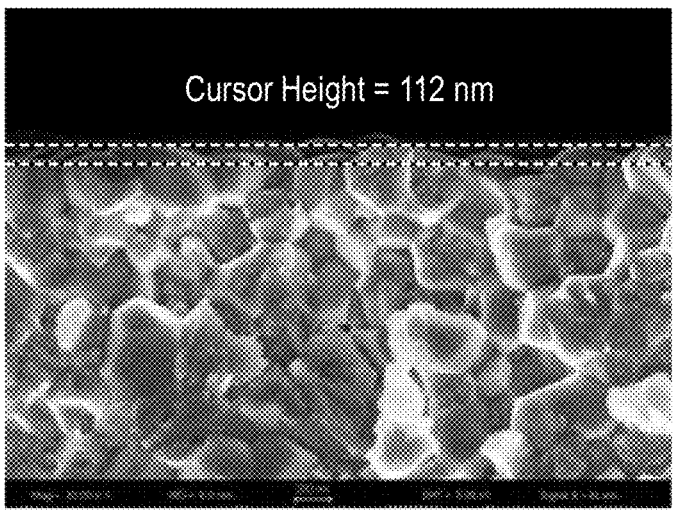

Batch materials comprising 66% by weight of zirconia nanoparticles (3YSZ) were tape cast to produce a green body, which was thermally treated at a temperature of 700° C. for 1 hour and subsequently sintered at 1300° C. for 1 hour. Zirconia waveguides having 20 μm and 40 μm thicknesses were produced. FIGS. 5A-C are scanning electron microscope (SEM) images of the waveguide (20 μm) thus produced (perspective, top, and cross-section views, respectively). A zirconia grain size of about 250-300 nm and a peak-to-valley height of the surface roughness features of about 112 nm were observed. The RMS surface roughness of the waveguide was approximately 40 nm.

The zirconia waveguides were spin coated with a planarizer layer comprising a mixture of polysiloxane 512B (Honeywell) diluted with isopropanol to a concentration of 10-50 weight % polysiloxane. Varying planarizer layer thicknesses were obtained, including 50 nm and 350 nm. OLED active materials (AlQ3) and Ag cathode materials were evaporated onto the waveguides both with and without planarizer layers. The resulting stack was placed on a glass substrate for optical surrogate measurements.

Figure 6:
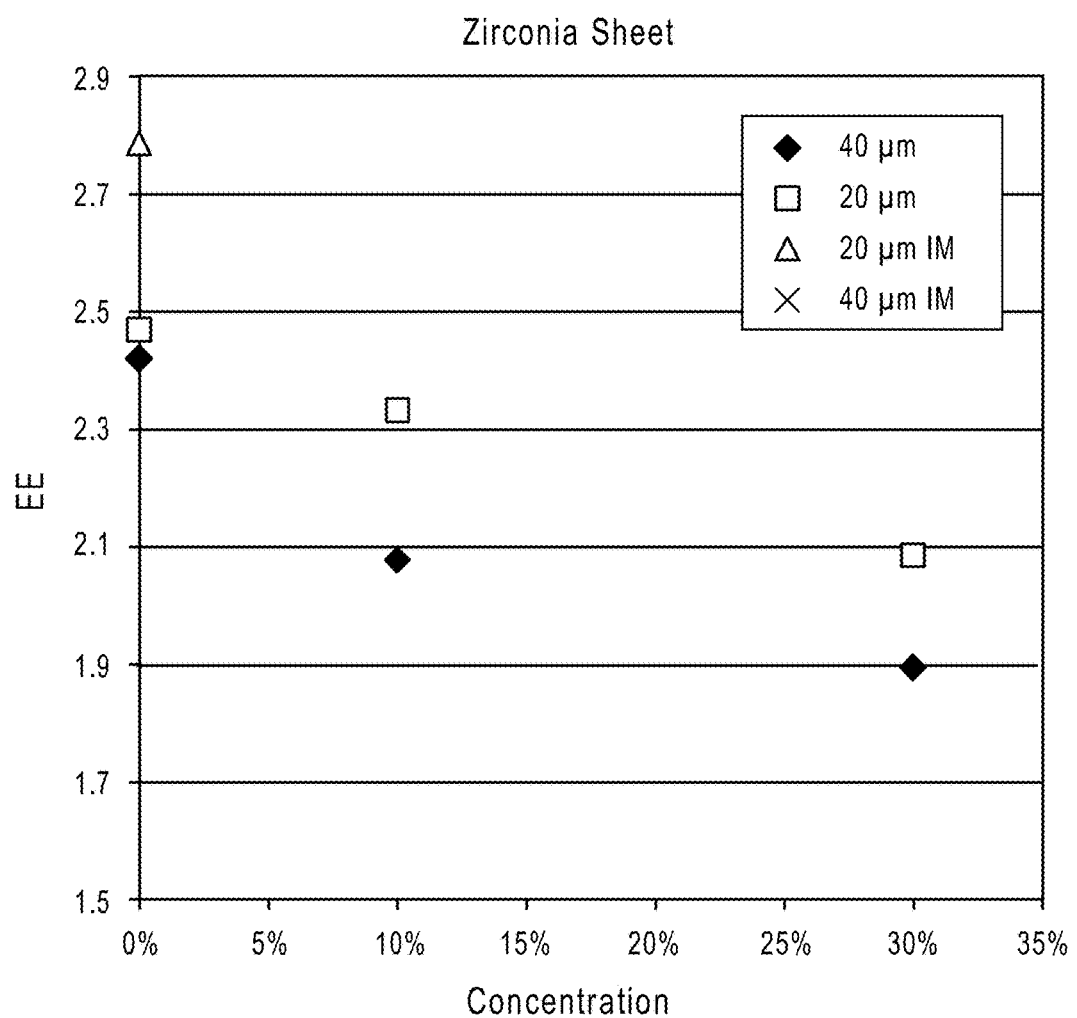
FIG. 6 is a graphical illustration of optical surrogate EE as a function of planarizer layer thickness for waveguides according to various embodiments of the disclosure.
Figure 7A:
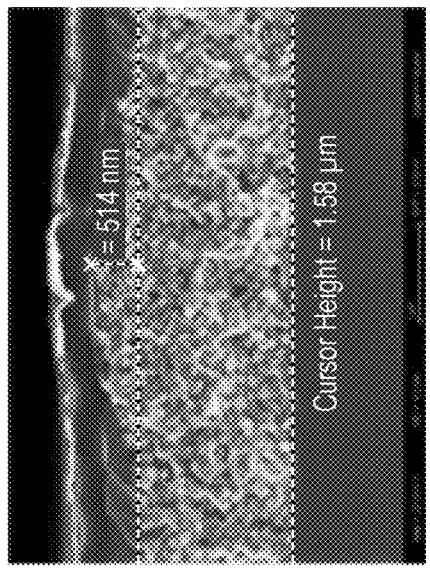
FIGS. 7A-D are SEM images of a waveguide according to various embodiments of the disclosure.
Figure 7B:
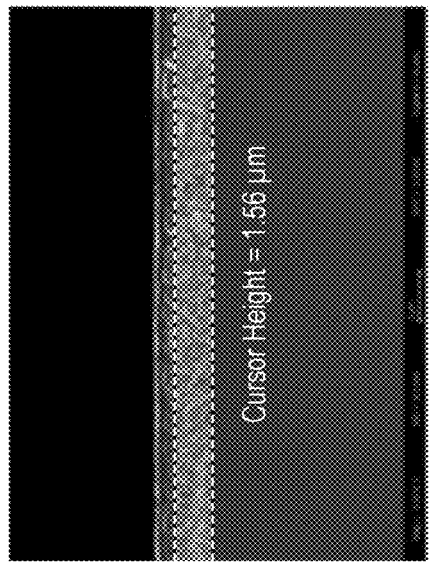
Figure 7C:
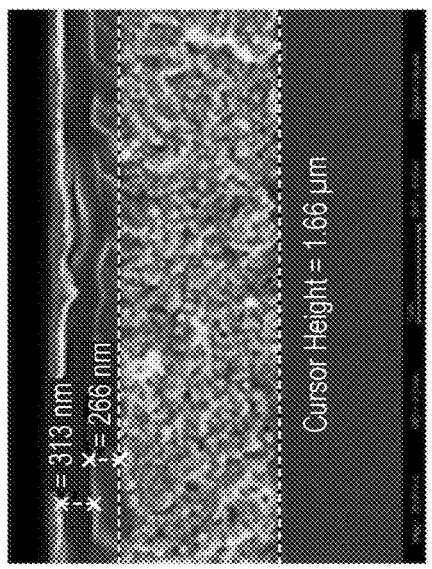
Figure 7D:
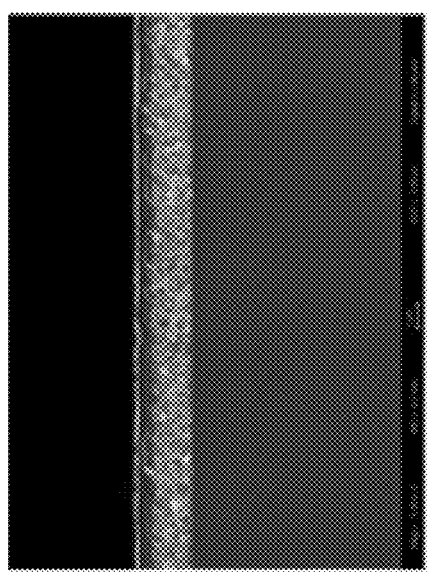

Optical surrogate extraction efficiency (EE) for the waveguides as a function of planarizer concentration (which can be correlated to the planarizer thickness) is depicted in FIG. 6. For waveguides without planarizer layers (concentration=0%), the EE value was observed to be greater than 2 for both 20 μm and 40 μm thick waveguides. With planarizer layers (concentration=10%, 30%), the waveguides exhibited EE values ranging from about 1.9 to 2.3. Higher EE values were observed when the air gap between the zirconia waveguide and the glass substrate was index matched with oil having a refractive index of 1.45.

The refractive index of zirconia is approximately 2.2 depending on the wavelength of the propagating light. This index can enable a good match of the waveguide parameters with the TCO-OLED layer. The effective index and thickness of the waveguide is such that there may be a corresponding mode in the guide. The extraction efficiency of the single-layer waveguide is believed to be by surface scattering mechanisms related to surface roughness at the zirconia-air boundary. Moreover, the EE values obtained for both waveguide thicknesses suggest that there is no dependence based on waveguide thickness.

Multi-Layer Waveguides

Zirconia nanoparticles (3YSZ) were mixed with ethanol/butanol solvent to create a batch mixture suitable for dip coating or slot coating. The batch materials were then coated onto a glass substrate and thermally treated at a temperature of 400° C. for 2 hours or 600° C. for 1 hour. The glass substrate with zirconia layer was then spin coated with a planarizer layer comprising a mixture of polysiloxane 512B (Honeywell) diluted with isopropanol to a concentration of 10-50 weight % polysiloxane. Varying planarizer layer thicknesses were obtained, including 100 nm and 400 nm. FIGS. 7A-D are SEM cross-sectional images of a waveguide thus produced. The SEM images illustrate a zirconia layer thickness of about 1.5 μm and a planarizer layer having a thickness of about 300 nm. The planarizer layer is observed to conform at least in part to the zirconia layer surface. The surface morphology of the zirconia nanostructure is sufficiently limited in roughness to enable a thinner smoothing (planarizer) layer, e.g., less than 500 nm.

Figure 8:
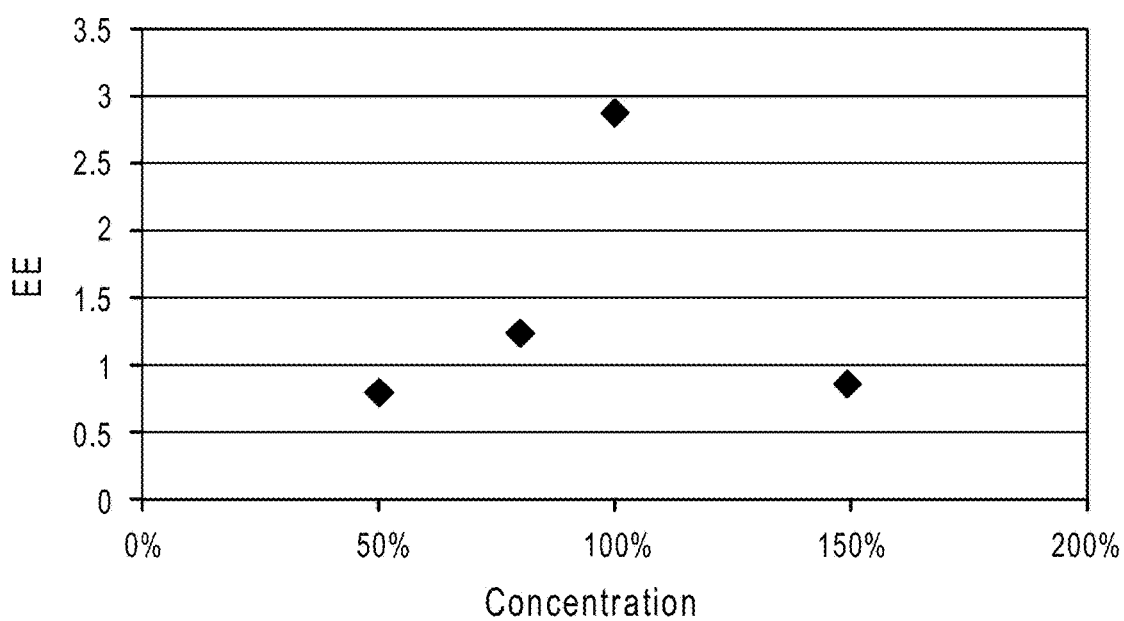
FIG. 8 is a graphical depiction of optical surrogate EE as a function of planarizer layer thickness for waveguides according to various embodiments of the disclosure.

OLED active materials (AlQ3) and Ag cathode materials were evaporated onto the waveguides. The resulting stacks were measured for extraction efficiency. Optical surrogate extraction efficiency (EE) for the waveguides as a function of planarizer concentration (which can be correlated to the planarizer thickness) is depicted in FIG. 8. The waveguide having a 300 nm planarizer layer (100% concentration) had the highest EE value at approximately 2.9. Thicker planarizer layers (>500 nm, 150% concentration) resulted in lower EE values, as did thinner planarizer layers (100 nm, 50% concentration).

Without wishing to be bound by theory, it is believed that the TCO/OLED interface does not contain lateral frequency components high enough to cause mode coupling of the OLED guided transverse electric (TE) and transverse magnetic (TM) modes within the OLED layers to the highly attenuated surface plasmon mode. However, the surface morphology does contain lateral surface frequencies high enough to cause mode coupling among the TE and TM modes, which can promote coupling from the lower, more tightly bound guided modes to the higher modes which are more easily extractable. Furthermore, voids in the coating layer can serve as volumetric scattering sites. Because the dimensions of these sites can be smaller than the wavelength of the propagating light, the light can be scattered at wider angles, which can enable more efficient extraction.

What is claimed is:

1. A waveguide comprising:
   (a) first and second opposing scattering surfaces;
   (b) a thickness ranging from about 1 µm to about 100 µm;
   (b) a periodicity ranging from about 0.5 µm to about 2 µm; and
   (c) an RMS roughness ranging from about 20 nm to about 60 nm.

2. The waveguide of claim 1, wherein the waveguide comprises a material having a refractive index of at least about 2.

3. The waveguide of claim 1, wherein the waveguide is a sheet of zirconia.

4. The waveguide of claim 1, wherein the waveguide comprises a grain size ranging from about 200 nm to about 500 nm.

5. The waveguide of claim 1, wherein the waveguide comprises a density greater than about 3 g/cm$^3$.

6. The waveguide of claim 1, further comprising a planarizer layer disposed on one or both of the first and second scattering surfaces.

7. The waveguide of claim 6, wherein the planarizer layer has a thickness of less than about 500 nm and an RMS roughness of less than about 30 nm.

8. An organic light-emitting diode comprising the waveguide of claim 1.

9. A method for making a waveguide, comprising:
   forming a green body from batch materials comprising at least one component having a refractive index of at least about 1.8, and optionally at least one additive chosen from dispersants, binders, and solvents; and
   sintering the green body at a temperature greater than about 1000° C. to form a waveguide having two scattering surfaces,
   wherein the waveguide comprises:
   (a) a thickness ranging from about 1 µm to about 100 µm;
   (b) a periodicity ranging from about 0.5 µm to about 2 µm; and
   (c) an RMS roughness ranging from about 20 nm to about 60 nm.

10. The method of claim 9, wherein forming the green body comprises tape casting, slot coating, spin coating, or dip coating the batch materials.

11. The method of claim 9, wherein the at least one component comprises zirconia nanoparticles.

12. The method of claim 9, further comprising applying a planarizer layer to one or both of the scattering surfaces.

13. The method of claim 12, wherein the planarizer layer is applied by spin coating, dip coating, or vacuum deposition methods.

14. The method of claim 9, further comprising heating the green body to a second temperature ranging from about 250° C. to about 700° C. prior to sintering.

15. A waveguide having at least one scattering surface, the waveguide comprising:
   a substrate; and
   at least one first layer comprising a first material having a refractive index of at least about 1.8 and having a thickness ranging from about 300 nm to about 10 µm; and
   optionally at least one second layer comprising a second material having a refractive index of less than about 1.8 and having a thickness of less than about 100 nm,
   wherein the waveguide comprises a periodicity ranging from about 0.5 µm to about 2 µm; and
   wherein the at least one scattering surface comprises an RMS roughness ranging from about 20 nm to about 60 nm.

16. The waveguide of claim 15, wherein the first layer comprises zirconia.

17. The waveguide of claim 15, wherein the first layer comprises a density greater than about 3 g/cm$^3$.

18. The waveguide of claim 15, wherein the first and second layers are arranged in alternating fashion.

19. The waveguide of claim 15, further comprising a planarizer layer having a thickness of less than about 500 nm and an RMS roughness of less than about 20 nm.

20. An organic light-emitting diode comprising the waveguide of claim 15.

21. A method for making a waveguide, comprising:
   coating a substrate with a first mixture comprising a first component having a refractive index of at least about 1.8;
   optionally coating the substrate with a second mixture comprising a second component having a refractive index of less than about 1.8; and
   heat treating the coated substrate at a temperature greater than about 250° C. to form a waveguide having at least one scattering surface.

22. The method of claim 21, wherein the first component comprises zirconia nanoparticles.

23. The method of claim 21, wherein coating the substrate with the first or second mixture comprises slot coating, spin coating, or dip coating.

24. The method of claim 21, further comprising applying a planarizer layer to the waveguide, wherein the planarizer layer has a thickness of less than about 500 nm and an RMS roughness of less than about 20 nm.

25. The method of claim 21, wherein the first and second mixtures are coated onto the substrate in alternating fashion.

26. The method of claim 21, wherein the coating comprising the first material has a thickness ranging from about 300 nm to about 10 µm and the coating comprising the second material has a thickness of less than about 100 nm.

27. A waveguide comprising:
   n first layers comprising a first material having a first refractive index;
   2n-1 scattering surfaces comprising an RMS roughness ranging from about 20 nm to about 60 nm;

n-1 second layers comprising a second material having a second refractive index lower than the first refractive index; and a planarizer layer having an RMS roughness of less than about 20 nm, wherein n is greater than or equal to 1.

28. An organic light-emitting diode comprising the multi-layer waveguide of claim 27 and an organic light-emitting layer in contact with the planarizer layer of the multi-layer waveguide.

* * * * *